(12) United States Patent
Antunez et al.

(10) Patent No.: US 10,367,075 B2
(45) Date of Patent: *Jul. 30, 2019

(54) APPROACH TO PREVENTING ATOMIC DIFFUSION AND PRESERVING ELECTRICAL CONDUCTION USING TWO DIMENSIONAL CRYSTALS AND SELECTIVE ATOMIC LAYER DEPOSITION

(71) Applicant: INTERNATIONAL BUSINESS MACHINES CORPORATION, Armonk, NY (US)

(72) Inventors: Priscilla D. Antunez, Tarrytown, NY (US); Damon B. Farmer, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/100,422

(22) Filed: Aug. 10, 2018

(65) Prior Publication Data
US 2019/0006468 A1    Jan. 3, 2019

Related U.S. Application Data

(63) Continuation of application No. 15/592,926, filed on May 11, 2017, now Pat. No. 10,096,679.

(51) Int. Cl.
| | | |
|---|---|---|
| *H01L 29/15* | (2006.01) | |
| *H01L 21/02* | (2006.01) | |
| *H01L 29/66* | (2006.01) | |
| *B32B 9/00* | (2006.01) | |
| *H01L 29/78* | (2006.01) | |
| *H01L 29/16* | (2006.01) | |

(52) U.S. Cl.
CPC ........ *H01L 29/66015* (2013.01); *B32B 9/007* (2013.01); *H01L 29/1606* (2013.01);
(Continued)

(58) Field of Classification Search
CPC ....... H01L 29/15; H01L 29/151; H01L 21/02; H01L 21/025; H01L 21/0252;
(Continued)

(56) References Cited

U.S. PATENT DOCUMENTS

| | | |
|---|---|---|
| 8,445,893 B2 | 5/2013 | Meric et al. |
| 8,747,947 B2 | 6/2014 | Miller |

(Continued)

OTHER PUBLICATIONS

List of IBM Patents or Patent Applications Treated as Related dated Aug. 10, 2018, 2 pages.

(Continued)

*Primary Examiner* — Monica D Harrison
(74) *Attorney, Agent, or Firm* — Tutunjian & Bitetto, P.C.; Vazken Alexanian

(57) ABSTRACT

A method of restricting diffusion of miscible materials across a barrier, including, forming a 2-dimensional material on a substrate surface, wherein the 2-dimensional material includes one or more defects through which a portion of the substrate surface is exposed, forming a plug selectively on the exposed substrate surface, and forming a cover layer on the plug and 2-dimensional material, wherein the cover layer material is miscible in the substrate material.

20 Claims, 5 Drawing Sheets

(52) U.S. Cl.
CPC ........ *H01L 29/66022* (2013.01); *H01L 29/78* (2013.01); *H01L 21/02444* (2013.01); *H01L 21/02458* (2013.01); *H01L 21/02485* (2013.01); *H01L 21/02499* (2013.01)

(58) Field of Classification Search
CPC ... H01L 21/02527; H01L 29/66; H01L 29/66; H01L 29/6601; H01L 29/66015; H01L 29/16; H01L 29/16; H01L 29/1606; H01L 29/6602; H01L 29/66022; H01L 29/78; H01L 21/024; H01L 21/0244; H01L 21/02444; H01L 21/0245; H01L 21/02458; H01L 21/02485; H01L 21/02499
USPC .......................................................... 257/629
See application file for complete search history.

(56) References Cited

U.S. PATENT DOCUMENTS

| | | |
|---|---|---|
| 9,011,968 B2 | 4/2015 | Miller et al. |
| 9,114,423 B2 | 8/2015 | Miller et al. |
| 10,096,679 B1* | 10/2018 | Antunez ............... H01L 29/151 |
| 2011/0092054 A1 | 4/2011 | Seo et al. |
| 2014/0339700 A1 | 11/2014 | Ren et al. |

OTHER PUBLICATIONS

Liu et al., "The integration of high-k dielectric on two-dimensional crystals by atomic layer deposition," Applied Physics Letters. vol. 100. Apr. 14, 2012. pp. 1-4.

Morrow et al., "Reivew of Graphene as a Solid State Diffusion Barrier," Materials Views—small-journal. vol. 12, No. 1. Nov. 2, 2015. pp. 120-134.

Van ' Erve et al., "Low-resistance spin injection into silicon using graphene tunnel barriers," Nature Nanotechnology—Articles. vol. 7. Sep. 30, 2012. pp. 737-742.

Wang et al., "Atomic Layer Deposition of Metal Oxides on Pristine and Functionalized Graphene," Journals of American Chemical Society—Communications. vol. 130, No. 26. Jun. 5, 2008. pp. 1-2.

Xuan et al., "Atomic-layer-deposited nanostructures for graphene-based nanoelectronics," Applied Physics Letters. vol. 92. Jan. 2, 2008. pp. 1-3.

* cited by examiner

APPROACH TO PREVENTING ATOMIC DIFFUSION AND PRESERVING ELECTRICAL CONDUCTION USING TWO DIMENSIONAL CRYSTALS AND SELECTIVE ATOMIC LAYER DEPOSITION

BACKGROUND

Technical Field

The present invention generally relates to utilizing 2-dimensional barrier materials to block atomic diffusion across the barrier, and more particularly to plugging openings in graphene using atomic layer deposition (ALD) to preferentially form plugs on underlying surfaces exposed through the 2-D material.

Description of the Related Art

Materials are known to migrate at the atomic level due to uneven forces acting on different species, for example, through electromigration and momentum transfer at crystal faces. In addition, miscible solid-state materials can interdiffuse due to thermal energy relative to a diffusion barrier height, as described by the Boltzmann distribution and Maxwell-Boltzmann statistics. Diffusion may be grain boundary diffusion or surface diffusion depending on the materials involved. Higher current densities can increase the Joule heating and momentum transfer to conductor atoms. Different chemical potentials and entropy factors can provide for mixing of materials at interfaces.

SUMMARY

In accordance with an embodiment of the present invention, a method of restricting diffusion of miscible materials across a barrier is provided. The method includes forming a 2-dimensional material on a substrate surface, wherein the 2-dimensional material includes one or more defects through which a portion of the substrate surface is exposed. The method further includes forming a plug selectively on the exposed substrate surface, and forming a cover layer on the plug and 2-dimensional material, wherein the cover layer material is miscible in the substrate material.

In accordance with another embodiment of the present invention, a method of restricting diffusion of miscible materials across a barrier is provided. The method includes forming a 2-dimensional material on a substrate surface, wherein the 2-dimensional material includes one or more defects through which a portion of the substrate surface is exposed, and the 2-dimensional material is graphene, hexagonal boron nitride, or hexagonal molybdenum sulfide. The method further includes forming a plug selectively on the exposed substrate surface, wherein the plug is aluminum oxide, hafnium oxide, or zirconium oxide, and forming a cover layer on the plug and 2-dimensional material, wherein the cover layer material is miscible with the substrate material.

In accordance with yet another embodiment of the present invention, a 2-dimensional diffusion barrier between two miscible materials is provided. The 2-dimensional diffusion barrier between two miscible materials includes a 2-dimensional material on a substrate surface, wherein the 2-dimensional material includes one or more defects through which a portion of the substrate surface is exposed. The 2-dimensional diffusion barrier between two miscible materials further includes a plug on each of the one or more defects. The 2-dimensional diffusion barrier between two miscible materials further includes a cover layer on each of the plugs and the 2-dimensional material, wherein the cover layer material is miscible in the substrate material, and wherein the 2-dimensional material forms a diffusion barrier between the cover layer and the substrate.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to preventing the interdiffusion of miscible solid-state materials, while preserving the electrical conductivity between the materials on a wafer scale.

Embodiments of the present invention relate generally to using a 2-dimensional (2-D) material, for example, graphene or hexagonal boron nitride (h-BN), to form a barrier between two miscible solid-state materials, and using a third material to plug openings in the 2-dimensional material to block interdiffusion at defects in the 2-dimensional material. The use of a third material to plug defects in the 2-dimensional material provides for larger surface area barriers, and use in technologically relevant devices.

Embodiments of the present invention also relate generally to selectively depositing materials only on defective areas of a 2-dimensional barrier layer, while leaving the defect-free areas bare, to maintain the electrical conductivity between the materials, while preventing the interdiffusion of the miscible solid-state materials. The deposition of the third material can serve as a patch for the defect sites, while allowing the diffusion barrier and electrical conductivity properties to be retained. Since the materials are not deposited on the pristine 2-D material areas, electrical conduction through the barrier can also retained.

To have technological significance, these barrier layers must be demonstrated to be effective for large areas (e.g., 150 mm-300 mm diameter wafers). However, on large areas, the 2-D lattice is not perfect, but rather riddled with structural defects. The defects can include atomic vacancies, grain boundaries, holes, tears, and wrinkles. The presence of these defects can destroy the diffusion barrier capabilities of the barrier layer.

Embodiments of the present invention also relate to using closed-bonded laminar materials as the 2-D material (e.g., graphene, h-BN, or $MoS_2$), and atomic layer deposition (ALD) to selectively form the patches over the defects in the laminar material. The thinness of the laminar material allows for electrical conduction through the barrier, for example, by electron tunneling.

Exemplary applications/uses to which the present invention can be applied include, but are not limited to: gated transistors, for example metal-oxide-semiconductor field effect transistors (MOSFETs), for example, to prohibit diffusion of copper interconnects, to prohibit diffusion and allow for control of graded photovoltaic material, to prohibit back-injection of spin current in spintronic devices, and to allowing for a rectifying tunnel to be realized (using an insulating 2D crystal).

Figure 1:
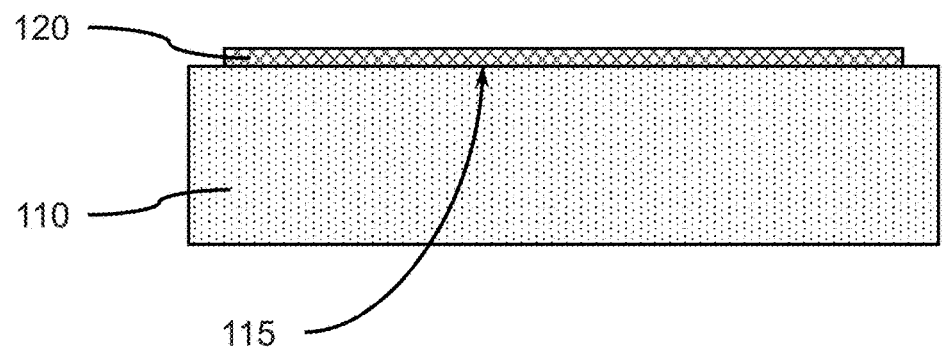
FIG. 1 is a cross-sectional side view showing a 2-dimensional material sheet on a substrate, in accordance with an embodiment of the present invention.

Referring now to the drawings in which like numerals represent the same or similar elements and initially to FIG. 1, a 2-dimensional material on a substrate is shown, in accordance with an embodiment of the present invention.

In one or more embodiments, a 2-dimensional material 120 can be formed on the surface 115 of a substrate 110, where the 2-dimensional material can be formed on the surface through growth and removal, mechanical exfoliation, transfer, or epitaxial growth. The 2-D material can be one or more monolayers thick depending on the formation process and process parameters, where the 2-D material forms a sheet. In various embodiments, the 2-D material 120 can be about 1 monolayer to about 4 monolayers thick, or less than about 2 nm, to allow electron tunneling through the 2-D material. The 2-D material 120 can be a conductor (e.g., graphene), a semiconductor (e.g., $MoS_2$), or an insulator (e.g., h-BN), where the 2-D material is a closed-bonded laminar material. Other closed-bonded laminar materials that can be utilized include black phosphorus, tungsten selenide (WSe2), and other transition metal dichalcogenides.

In one or more embodiments, the substrate 110 can be a semiconductor material, including, but not limited to, IV semiconductors (e.g., Si, Ge), binary III-V and II-VI semiconductors (e.g., ZnTe, GaN, GaAs, InSb, etc.), ternary semiconducting compounds (e.g., aluminum-gallium-arsenide (AlGaAs) and quaternary semiconducting compounds (e.g., copper-zinc-tin-sulfide (CZTS), copper indium gallium selenide (CIGS), etc.). The substrate surface can be a single crystal semiconductor or photovoltaic material. The substrate 110 can be an insulator material, including but not limited to, glasses, ceramics, and plastics. The substrate 110 can be a conductive material, including but not limited to, metals, metal nitrides, metal carbides, and metal silicides.

Since the 2-D material can be exfoliated and mechanically transferred to the substrate surface 115, different substrate materials to which the 2-D material can be transferred or grown on could be used. In various embodiments, 2-D material 120 can adhere to the surface 115 of the substrate 110 through van der Waals interactions, such that the different classes (i.e., conductor, insulator, semiconductor) of 2-D material 120 can be applied to different classes of substrates 110.

Figure 2:
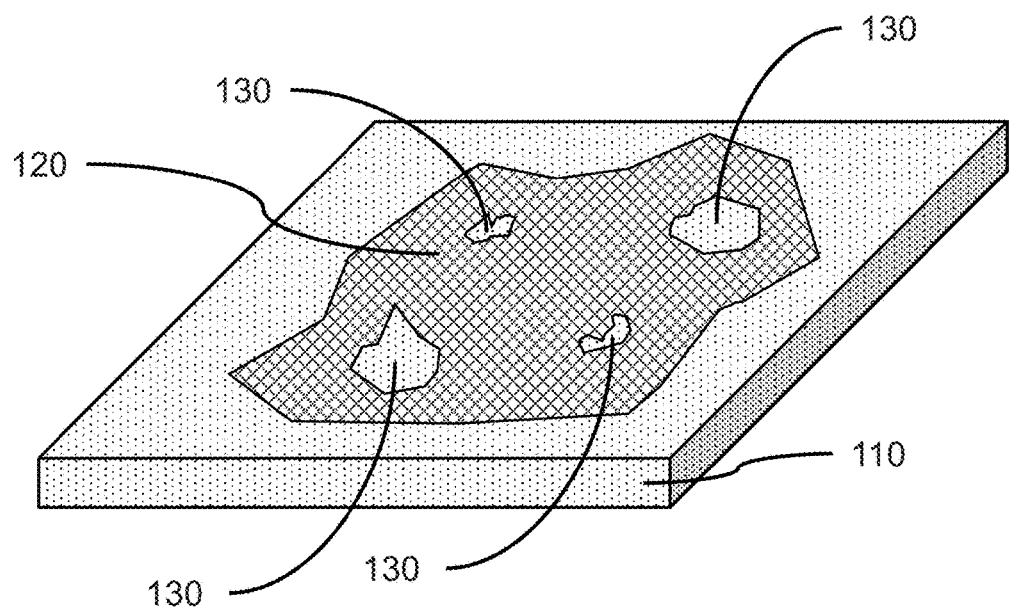
FIG. 2 is a perspective view showing a 2-dimensional material sheet on a substrate, and defects in the material sheet exposing the underlying substrate, in accordance with an embodiment of the present invention.

FIG. 2 is a perspective view showing a 2-dimensional material sheet on a substrate, and defects in the sheet exposing the underlying substrate, in accordance with an embodiment of the present invention.

In one or more embodiments, the 2-dimensional material sheet 120 can have one or more defects 130, including, discontinuities and imperfections, that would allow atoms of a material to pass from one side of the 2-dimensional material to the other side of the 2-D material, whereas the continuous regions of the 2-dimensional material can act as a diffusion barrier. For example, macroscopically, a graphene lattice possesses a certain amount of imperfections, including atomic vacancies, processing residues, tears, wrinkles, and holes through which another material could pass. The graphene lattice can be riddled with imperfections, which becomes more evident as the graphene surface area increases, due to entropy and probability.

In various embodiments, the 2-dimensional material sheet 120 can cover an area in the range of about 17,000 $mm^2$ to about 32,000 $mm^2$. The 2-dimensional material sheet 120 may not be uniformly flat on the substrate surface.

Figure 3:
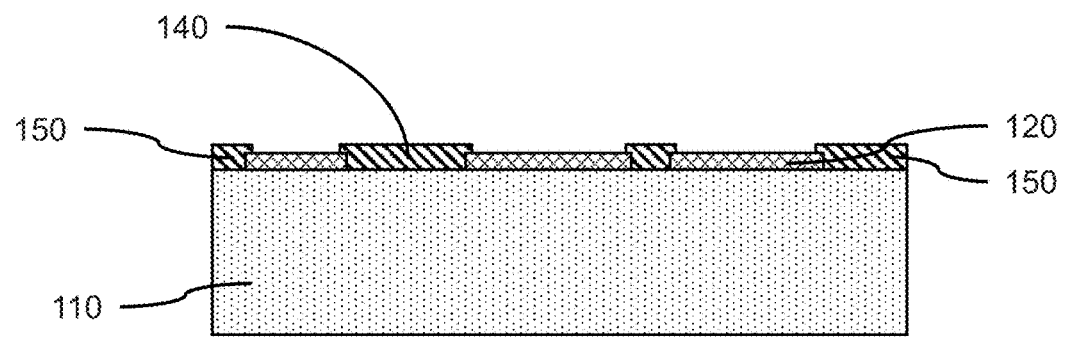
FIG. 3 is a cross-sectional side view showing a plurality of plugs on isolated regions of the 2-dimensional material, in accordance with an embodiment of the present invention.

FIG. 3 is a cross-sectional side view showing a plurality of plugs on isolated regions of the 2-dimensional material, in accordance with an embodiment of the present invention.

In one or more embodiments a plug 140 can be formed on the surface 115 of the substrate 110 not covered by the 2-dimensional material 120. The plugs 140 can form on the substrate surface exposed through defects 130 in the 2-dimensional material 120 and along the periphery of the 2-dimensional material 120. The plugs can be formed by atomic layer deposition (ALD) and plasma enhanced atomic layer deposition (PEALD), where the process parameters (e.g., plasma energy, temperature) are controlled to minimize radiation and energy damage to the 2-dimensional material 120.

In various embodiments, any material depositable by ALD or PEALD can be used to form the plug 140, where the ALD or PEALD chemistry provides a selective chemical reaction with the exposed surface 115 of the substrate material. The plugs 140 can be a metal, an insulator, or a semiconductor depending on the ALD process utilized. For example, aluminum oxide ($Al_2O_3$) can be formed by and ALD process utilizing trimethyl aluminum $Al((CH_3)_3)$ and oxygen. $SiH_2Cl_2$ or $SiCl_4$ and ammonia ($NH_3$) can be used for selective thermal ALD deposition of silicon nitride (SiN) on a silicon surface. Organo-metallic precursors can be used to form metal and metal oxide plugs 140 by ALD. The plugs 140 can be an insulator, semiconductor, metal, oxide, nitride, carbide, silicide, or a combination thereof. The plugs 140 can be, for example, $Al_2O_3$, $HfO_2$, and $ZrO_2$.

Figure 4:
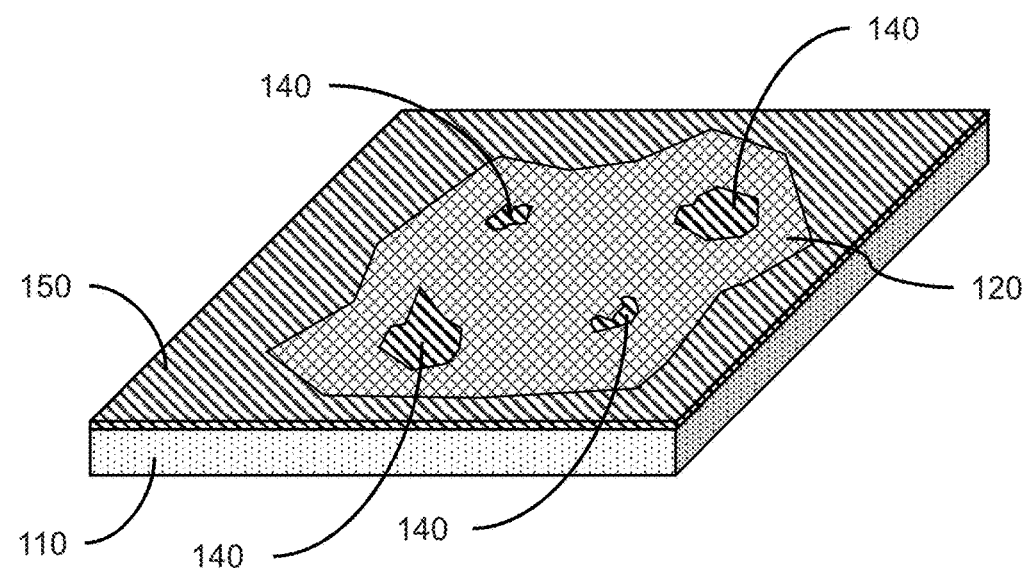
FIG. 4 is a perspective view showing a plurality of plugs covering isolated regions of the substrate and 2-dimensional material, in accordance with an embodiment of the present invention.

FIG. 4 is a perspective view showing a plurality of plugs covering isolated regions of the substrate and 2-dimensional material, in accordance with an embodiment of the present invention.

The ALD or PEALD precursors can react with bonding sites on the substrate surface 115 and dangling bonds of the 2-dimensional material 120, which may be present on the periphery of a 2-dimensional material sheet 120 and at the edges of defects 130. The formation of multiple layers of material through ALD and/or PEALD can form the plugs 140 on the exposed surface of the substrate and the edges and periphery of the 2-dimensional material 120, where the plug 140 can cover the defect and extend over the edges and periphery. A mask 150 can be formed on the periphery of the 2-dimensional material 120 where the mask 120 covers exposed portions of the substrate 110 beyond the periphery of the 2-dimensional material 120. The mask 150 can be continuous around the 2-dimensional material 120, or the mask may be segmented or interrupted.

Figure 5:
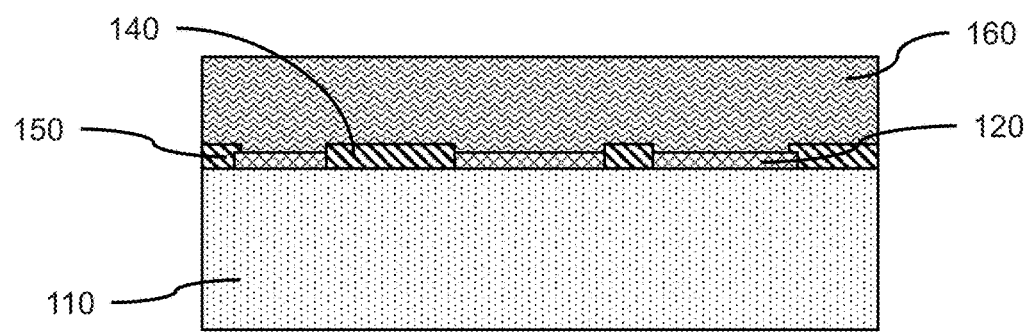
FIG. 5 is a cross-sectional side view showing a cover layer on the 2-dimensional material and plugs, in accordance with an embodiment of the present invention.

FIG. 5 is a cross-sectional side view showing a cover layer on the 2-dimensional material and plugs, in accordance with an embodiment of the present invention.

In one or more embodiments, the cover layer can be formed on the plugs 140, mask 150, and exposed portions of the 2-dimensional material 120.

A cover layer 160 can be a second material different from the substrate 110 or the same material as the substrate. The cover layer 160 can be an insulator material, a conductive material, a semiconductor material, or a combination thereof.

Figure 6:
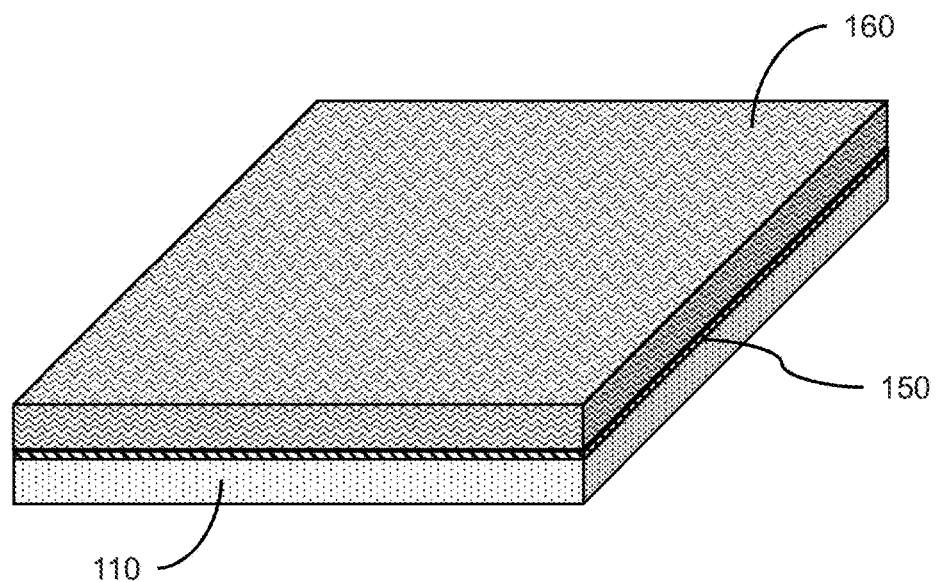
FIG. 6 is a perspective view showing the second material on the 2-dimensional material and plugs, in accordance with an embodiment of the present invention.

FIG. 6 is a perspective view showing the second material on the 2-dimensional material and plugs, in accordance with an embodiment of the present invention.

The cover layer 160 can cover the entire substrate and 2-dimensional material 120. The cover layer can have a flat, uniform surface.

Figure 7:
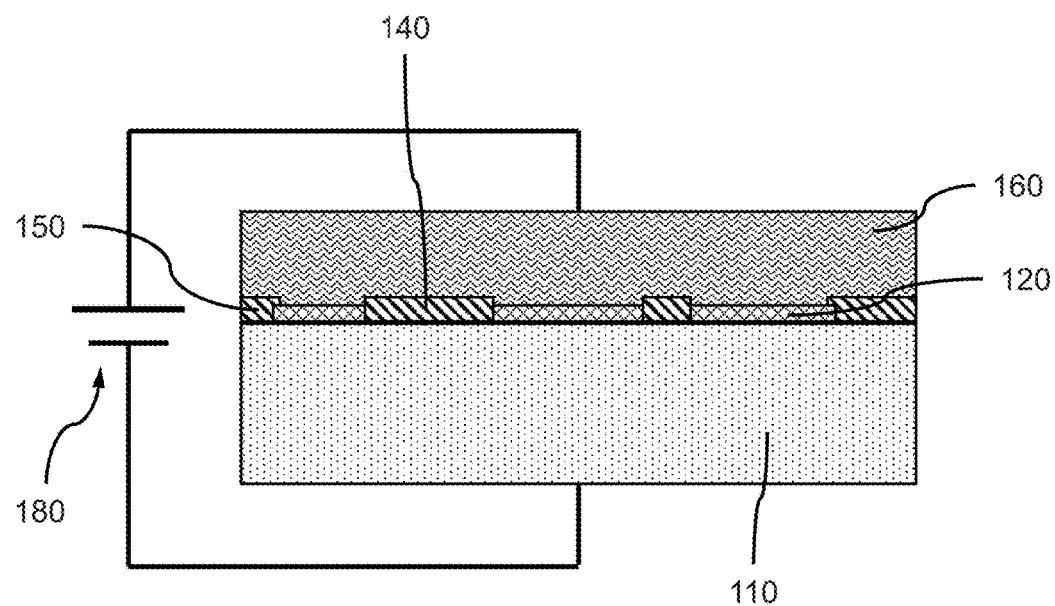
FIG. 7 is a diagram showing a current source connected to the substrate and the second material, in accordance with an embodiment of the present invention.

FIG. 7 is a diagram showing a current source connected to the substrate and the second material, in accordance with an embodiment of the present invention.

In various embodiments, the cover layer 160 and substrate 110 can be electrically connected to a current source 180 that can provide a flow of electricity across the 2-dimensional material 120. The plugs 140 can be a dielectric material having a thickness that prevents tunneling of current, whereas the 2-dimensional material 120 can have a thickness that allows tunneling, so an electric current can flow across the barrier formed by the 2-dimensional material 120.

Figure 8:
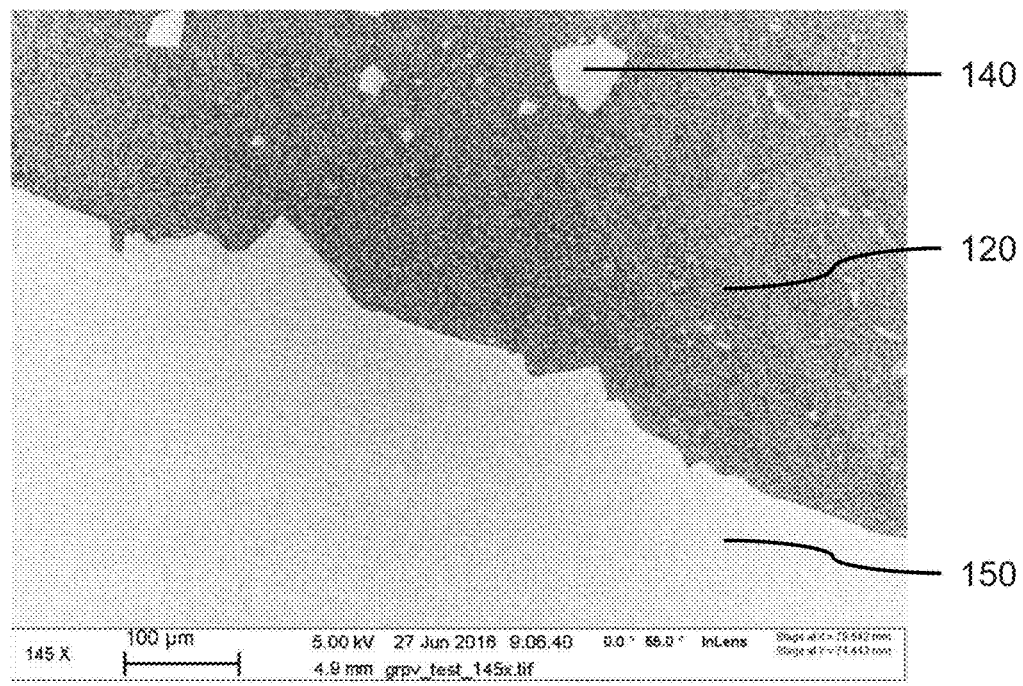
FIG. 8 is a Scanning Electron Microscope (SEM) image of plugs selectively formed on regions of a graphene sheet and an underlying copper-zinc-tin-sulfide (CZTS) substrate surface, in accordance with an embodiment of the present invention.

FIG. 8 is a Scanning Electron Microscope (SEM) image of plugs selectively formed on regions of a graphene sheet and an underlying copper-zinc-tin-sulfide (CZTS) substrate surface, in accordance with an embodiment of the present invention.

Aluminum oxide ($Al_2O_3$) plugs 140 and mask 150 are shown on a graphene 2-dimensional material 120. The aluminum oxide ($Al_2O_3$) is shown to adhere to the underlying CZTS substrate, while not adhering to the graphene sheet.

Figure 9:
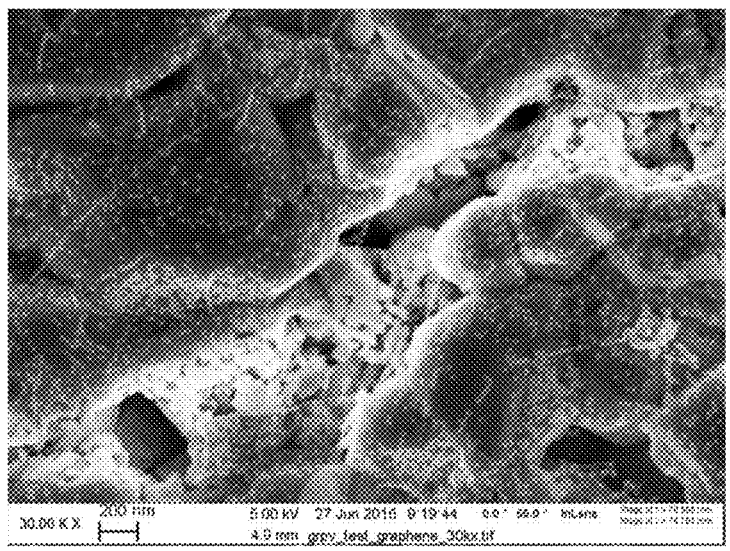
FIG. 9 is a magnified Scanning Electron Microscope image of a uniform coating on an underlying CZTS substrate surface exposed through defects in the graphene, in accordance with an embodiment of the present invention.

FIG. 9 is a magnified Scanning Electron Microscope image of a uniform coating on an underlying CZTS substrate surface exposed through defects in the graphene, in accordance with an embodiment of the present invention.

Exposed CZTS inside the defects, where there is no graphene, is uniformly coated (lighter regions). In contrast, ALD nucleation on areas covered by graphene are much more sparsely coated, where the graphene is the darker regions.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or including, when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or features) as illustrated in the FIGS. it will be understood that the spatially relative terms are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:
1. A method of restricting diffusion of miscible materials across a barrier, comprising:
    forming a plug selectively on each portion of a substrate surface exposed through one or more defects in a 2-dimensional material on the substrate surface; and
    forming a solid cover layer on the plug and 2-dimensional material, wherein at least a component of the solid cover layer material is miscible in the substrate material.

2. The method of claim 1, wherein the 2-dimensional material has a thickness of less than about 2 nm, where the thickness allows electron tunneling through the 2-dimensional material.

3. The method of claim 1, wherein the 2-dimensional material has a thickness of about 1 monolayer to about 4 monolayers.

4. The method of claim 1, wherein the plug is selectively formed by atomic layer deposition or plasma enhance atomic layer deposition.

5. The method of claim 4, wherein the plug is a metal, an insulator, or a semiconductor.

6. The method of claim 5, wherein the substrate is an insulator material, a conductive material, a semiconductor material, or a combination thereof, and each of the plugs is a different material than the substrate.

7. The method of claim 6, wherein each of the plugs is thicker than the 2-dimensional material.

8. The method of claim 6, wherein the 2-dimensional material is graphene, hexagonal boron nitride, or hexagonal molybdenum sulfide.

9. The method of claim 6, wherein each of the plugs is made of aluminum oxide, hafnium oxide, or zirconium oxide.

10. A method of restricting diffusion of miscible materials across a barrier, comprising:
    forming a plug selectively on each portion of a substrate surface exposed through one or more defects in a 2-dimensional material on the substrate surface, wherein the 2-dimensional material is graphene, hexagonal boron nitride, or hexagonal molybdenum sulfide; and
    forming a solid cover layer on the plug and 2-dimensional material, wherein at least a component of the solid cover layer material is miscible in the substrate material.

11. The method of claim 10, further comprising electrically connecting a current source to the cover layer and the substrate, and passing a current across the 2-dimensional material.

12. The method of claim 11, wherein the 2-dimensional material has a thickness of about 1 monolayer to about 4 monolayers.

13. The method of claim 12, wherein each of the plugs is selectively formed by thermal atomic layer deposition, and wherein the plug is aluminum oxide, hafnium oxide, or zirconium oxide.

14. The method of claim 13, wherein each of the plugs is a different solid material than the substrate.

15. The method of claim 14, wherein the 2-dimensional material forms a diffusion barrier between the cover layer and the substrate.

16. A 2-dimensional diffusion barrier between two miscible materials, comprising:
    a 2-dimensional material on a substrate surface, wherein the 2-dimensional material includes one or more defects through which a portion of the substrate surface is exposed;
    a plug on each portion of the substrate surface exposed through one or more defects, wherein the plug is aluminum oxide, hafnium oxide, or zirconium oxide.

17. The 2-dimensional diffusion barrier of claim 16, wherein the 2-dimensional material has a thickness of less than about 2 nm, where the thickness allows electron tunneling through the 2-dimensional material.

18. The 2-dimensional diffusion barrier of claim 17, wherein the 2-dimensional material is graphene, hexagonal boron nitride, or hexagonal molybdenum sulfide.

19. The 2-dimensional diffusion barrier of claim 18, further comprising a solid cover layer on the 2-dimensional material, wherein at least a component of the cover layer material is miscible in the substrate material, and wherein the 2-dimensional material forms a diffusion barrier between the cover layer and the substrate.

20. The 2-dimensional diffusion barrier of claim 19, wherein the substrate is a semiconductor, and the 2-dimensional material covers an area of the substrate in the range of about 17,000 mm$^2$ to about 32,000 mm$^2$.

* * * * *